(12) United States Patent
Lin et al.

(10) Patent No.: US 7,785,124 B2
(45) Date of Patent: Aug. 31, 2010

(54) ELECTRICAL CONNECTOR HAVING HEAT SINK WITH LARGE DISSIPATION AREA

(75) Inventors: Wei-Chih Lin, Tu-Cheng (TW); Wen-Yi Hsieh, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/502,762

(22) Filed: Jul. 14, 2009

(65) Prior Publication Data

US 2010/0009558 A1    Jan. 14, 2010

(30) Foreign Application Priority Data

Jul. 14, 2008    (TW) .................................. 97212471

(51) Int. Cl.
*H01R 13/62* (2006.01)
(52) U.S. Cl. ...................................... 439/330
(58) Field of Classification Search ................ 439/331, 439/330, 354, 487; 324/755; 361/704
See application file for complete search history.

(56) References Cited

U.S. PATENT DOCUMENTS

| | | | | |
|---|---|---|---|---|
| 6,570,398 | B2 * | 5/2003 | Murphy et al. | 324/755 |
| 6,752,645 | B2 * | 6/2004 | Nakamura et al. | 439/330 |
| 6,945,792 | B2 * | 9/2005 | Hayakawa | 439/73 |
| 7,097,488 | B2 | 8/2006 | Hayakawa et al. | |
| 7,195,507 | B2 | 3/2007 | Watanabe | |
| 7,566,237 | B2 * | 7/2009 | Gattuso et al. | 439/331 |

\* cited by examiner

*Primary Examiner*—Chandrika Prasad
(74) *Attorney, Agent, or Firm*—Andrew C. Cheng; Wei Te Chung; Ming Chieh Chang

(57) ABSTRACT

An electrical connector (1) for receiving an IC package includes a socket body (2) with a plurality of contacts (4) therein. A cover (3) is pivotally mounted with respect to the socket body (2) and defines an inner side close to the socket body (2) and an outer side opposite to the socket body (2). A heat sink (5) is provided to be mounted with the cover (3) by a plurality of fasteners (6). The fasteners (6) are inserted into the cover (3) and the heat sink (6) from the inner side of the cover (3).

16 Claims, 4 Drawing Sheets

ELECTRICAL CONNECTOR HAVING HEAT SINK WITH LARGE DISSIPATION AREA

BACKGROUND OF THE INVENTION

1. Field of the Invention

The present invention relates to an electrical connector, particularly to an electrical connector for testing an IC package received therein, and more particularly to an electrical connector incorporated with a heat sink for heat dissipation.

2. Description of Prior Art

IC packages are usually subjected to undergo a so-called burn-in test, in which the IC packages are placed in an oven and operated for an extended period of time at an elevated temperature, and under a voltage source that is greater than the rated value. Only those IC packages passed the test are ready for shipment. An electrical connector that configured with a heat sink is necessary to process such a burn-in test for an IC package, in which the heat sink works to dissipate the heat built-up resulted from operation of the IC package, and also keep a stable environment in which the IC package is nominal to operate.

U.S. Pat. No. 6,945,792 issued to on Kenji on Sep. 20, 2005 discloses an electrical connector for receiving and testing an IC package. The electrical connector is configured with a heat sink pivotally mounted with respect to a socket body, in which the IC package is contained. The heat sink has lots of fins and is attached to a rotatable member by four screws. The screws are inserted downwardly into the heat sink and the rotatable member from a top end of the heat sink, and thereby locking the heat sink along with the rotatable member.

However, since the screws in Kenji are mounted from the top end of the heat sink and located on opposite sides of the group of the fins, the area available for distribution of the fins is relatively reduced and the amount of the fins is thereby limited, which consequently affect the heat-dissipation performance.

SUMMARY OF THE INVENTION

It is therefore the object of the present invention to provide an electrical connector configured with a heat sink having sufficient heat-dissipation area.

In accordance with the present invention, an electrical connector for receiving an IC package is provided, which includes a socket body with a plurality of contacts therein. A cover is pivotally mounted with respect to the socket body and defines an inner side close to the socket body and an outer side opposite to the socket body. A heat sink is provided to be mounted with the cover by a plurality of fasteners. The fasteners are inserted into the cover and the heat sink from the inner side of the cover.

BRIEF DESCRIPTION OF THE DRAWINGS

Other objects, advantages and novel features of the present invention will become more apparent from the following detailed description when taken in conjunction with the accompanying drawings, in which.

DETAILED DESCRIPTION OF PREFERRED EMBODIMENT

Figure 1:
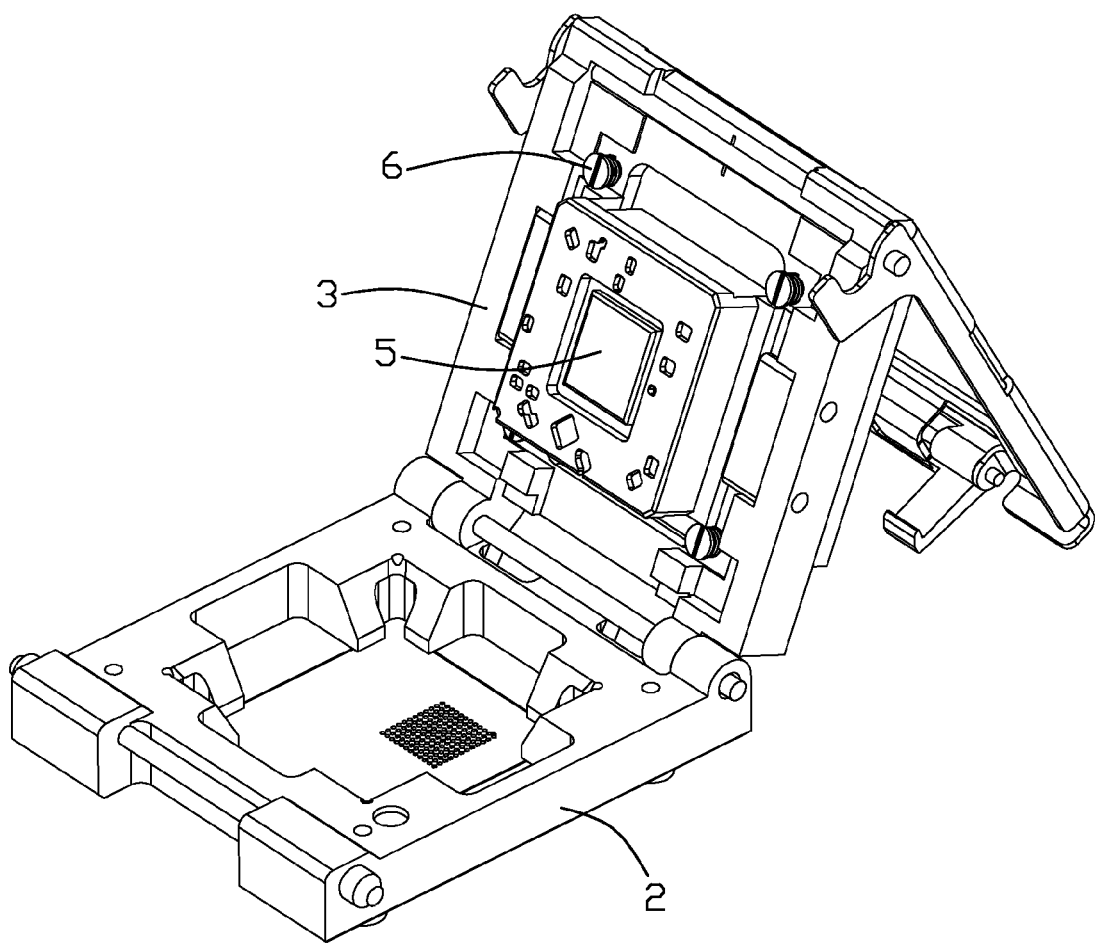
FIG. 1 is an assembled, perspective view of an electrical connector in accordance with a preferred embodiment of the present invention.
Figure 2:
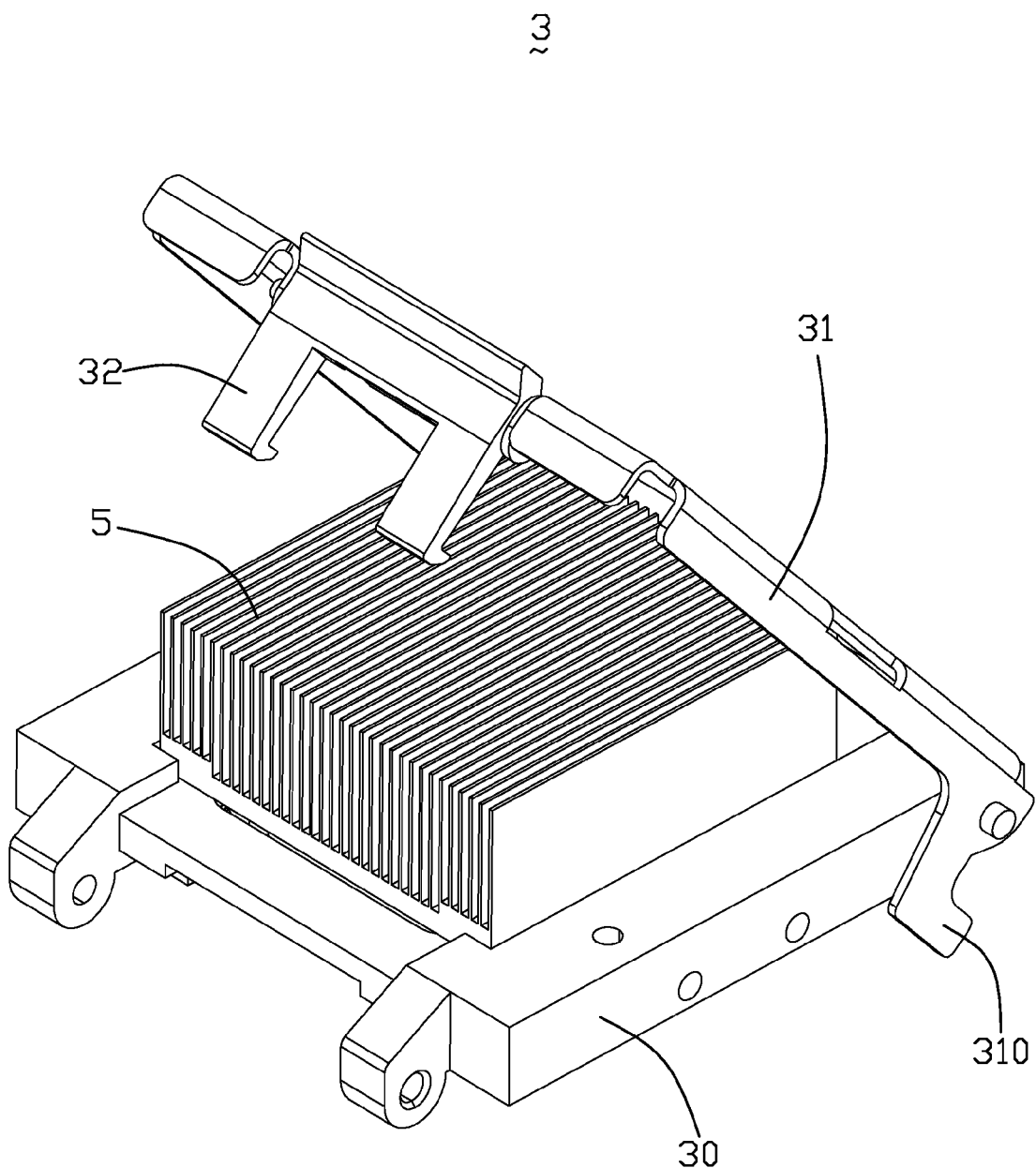
FIG. 2 is an assembled, perspective view of a cover and a heat sink in accordance with the preferred embodiment of the present invention.
Figure 3:
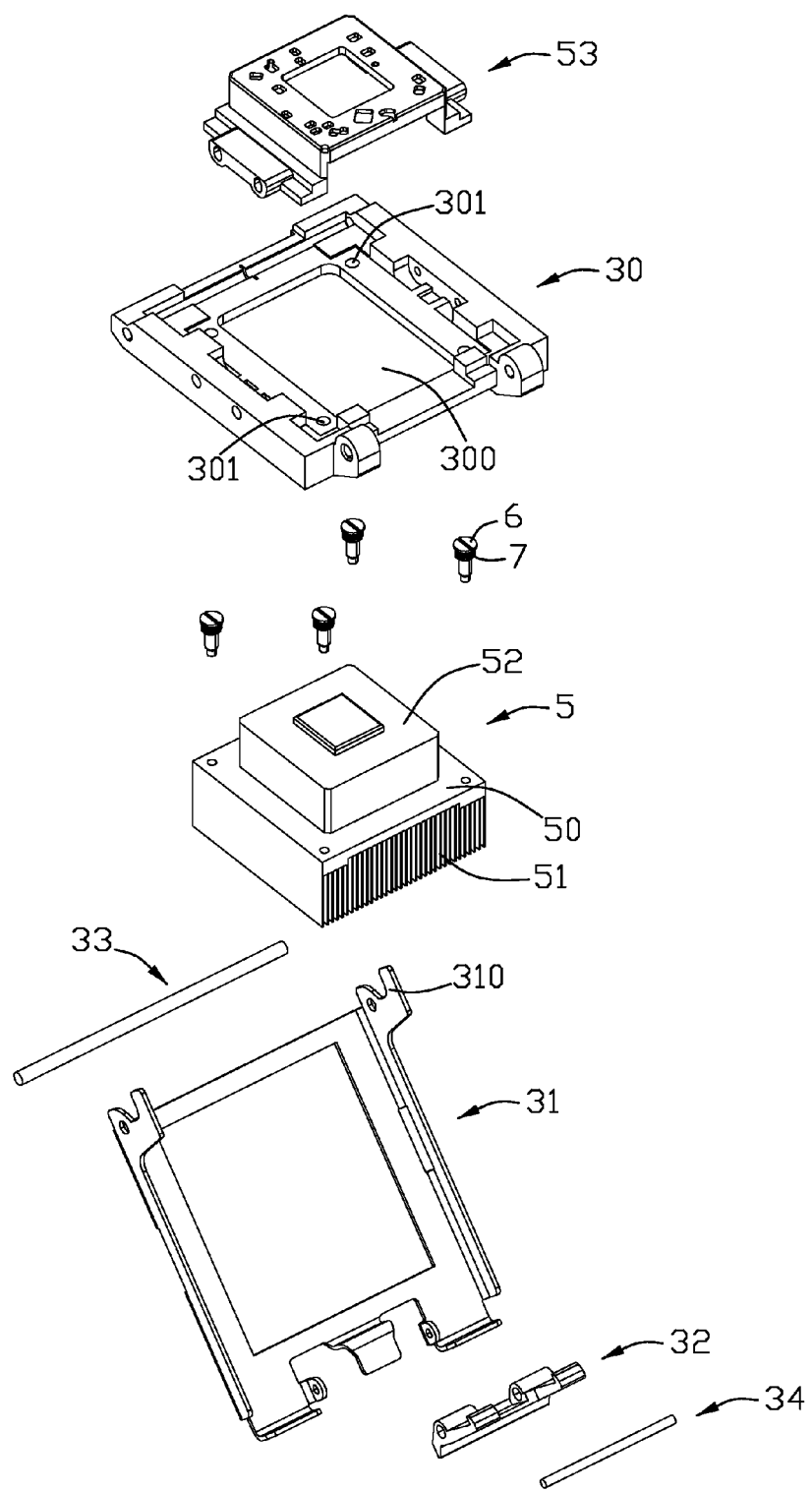
FIG. 3 is an exploded, perspective view of FIG. 2.
Figure 4:
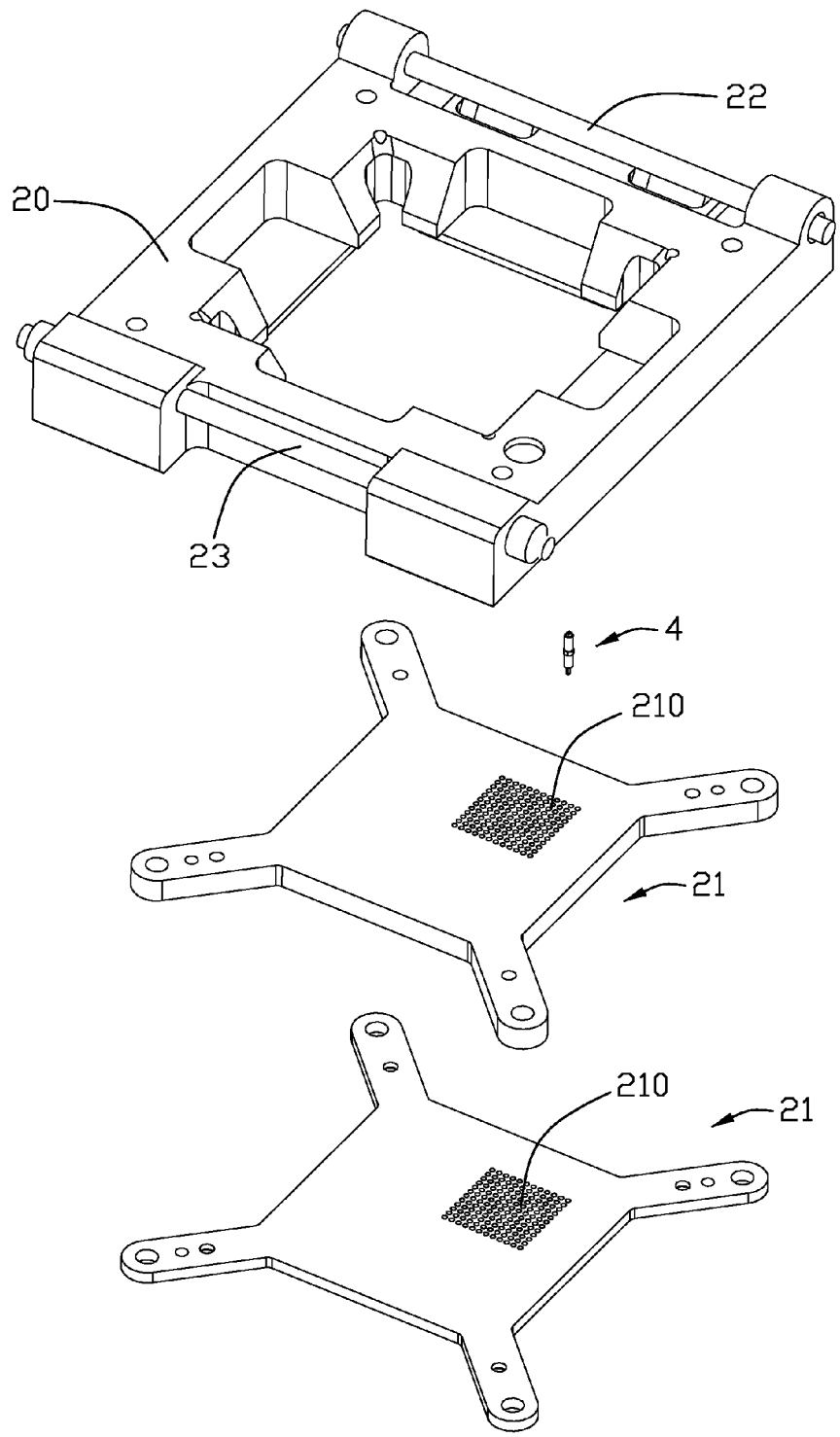
FIG. 4 is an exploded, perspective view of a socket body in accordance with the preferred embodiment of the present invention.

FIGS. 1-4 illustrate an electrical connector 1 made in accordance with a preferred embodiment of the present invention, which includes a socket body 2, a cover 3 pivotally mounted with respect to the socket body 2. A plurality of contacts 4 are received in the socket body for electrical connection with an IC package (not shown) contained in the socket body 2. A heat sink 5 is provided to be mounted with the cover 3 and move along with the cover 3.

The socket body 2 further includes a housing 20 defining an receiving room for the IC package, and a pair of mounting plates 21 for retaining the contacts 4. Each mounting plate 21 is formed with a number of receiving holes 210 and the contact 4 is disposed between the two mounting plates 21 with two ends of the contact 4 respectively extending into the receiving holes 210 of the two mounting plates 21. A pair of opposite ends of the housing 20 is respectively provided with a first shaft 22 and a second shaft 23 for engaging with the cover 3.

The cover 3 rotates relative to the socket body 2 and defines an inner side close to the socket body 2 and an outer side opposite to the socket body 2. The cover 3 includes a base member 30 and a metal stiffener 31 pivotally attached to the base member 30. The base member 30 is configured of a frame shape with an opening 300 at a central position thereof. One end of the base member 30 is connected to the housing 20 via the shaft 22, and the other end is connected to the stiffener 31 via a third shaft 33. The stiffener 31 has a pair of the hooks 310 formed near two ends of the third shaft 33. The other end of the stiffener 31 opposite to the hooks 310 is provided with a forth shaft 34 to connect a latch 32. When the electrical connector 1 is operated to a closed position, the hooks 310 engage with the second shaft 23 and the latch 32 clasps the housing 20, thereby enabling the cover 3 to tightly cover upon the socket body 2.

The heat sink 5 includes a main section 50, a group of fins 51 extending upward from the main section 50 for heat dissipation, and a protruding section 52 extending downwardly from the main section 50 for touching a top surface of the IC package. A pressing unit 53 is mounted with the base member 30 and is shaped to cover the protruding section 52. The heat sink 5 is mounted to the outer side of the cover 3 with the protruding section 52 passing through the opening 300 of the cover 3. Four threaded holes 301 are formed at appropriate positions of the base member 30 and four fasteners 6 (screws in this preferred embodiment) are inserted into the threaded holes 301 of the cover 3 and the heat sink 5 from the inner side of the cover 3, so as to lock the heat sink 5 along with the cover 3. A spring member 7 is additionally disposed on the fastener 6 to elastically abut against the main section 50 of the heat sink 5. The fasteners 6 do not extend into the group of the fins 51 of the heat sink 5 so that the group of fins 51 can cover a whole area of a top surface of the heat sink 5. Therefore the amount of the fins is increased and more sufficient heat-dissipation area is obtained.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for receiving an IC package comprising:
   a socket body with a plurality of contacts therein;
   a cover pivotally mounted with respect to the socket body and defining an inner side close to the socket body and an outer side opposite to the socket body; and
   a heat sink mounted with the cover by a plurality of fasteners, the fasteners being inserted into the cover and the heat sink from the inner side of the cover.

2. The electrical connector as claimed in claim 1, wherein the heat sink comprises a main section and a protruding section extending from the main section and passing through an opening defined by the cover.

3. The electrical connector as claimed in claim 2, wherein the heat sink further comprises a group of fins substantially covering a whole area of the main section.

4. The electrical connector as claimed in claim 1, wherein the socket body comprises a housing defining a receiving room for the IC package and a mounting plate for retaining the contacts, the housing being provided with two shafts at opposite ends thereof for engaging with the cover.

5. The electrical connector as claimed in claim 1, wherein the cover comprises a base member of a frame shape and a stiffener pivotally attached to the base member.

6. The electrical connector as claimed in claim 5, wherein the stiffener is configured with a hook and a latch, respectively at two opposite ends thereof, both of the hook and the latch engaging with the socket body to lock the cover to tightly cover upon the socket body.

7. The electrical connector as claimed in claim 1, wherein each fastener is configured with a spring member disposed thereon for elastically abutting against the heat sink.

8. An electrical connector for receiving an IC package comprising:
   a socket body with a plurality of contacts therein;
   a cover pivotally mounted with respect to the socket body and defining an inner side close to the socket body and an outer side opposite to the socket body;
   a heat sink mounted to the outer side of the cover and having a group of fins for heat dissipation; and
   a plurality of fasteners mounted to the cover from the inner side thereof and locked into the heat sink without extending into the group of fins of the heat sink so that the group of fins can substantially cover a whole top surface of the heat sink.

9. The electrical connector as claimed in claim 8, wherein the heat sink comprises a main section and a protruding section extending from the main section and passing through an opening defined by the cover.

10. The electrical connector as claimed in claim 8, wherein the socket body comprises a housing defining a receiving room for the IC package and a mounting plate for retaining the contacts, the housing being provided with two shafts at opposite ends thereof for engaging with the cover.

11. The electrical connector as claimed in claim 8, wherein the cover comprises a base member of a fame shape and a stiffener pivotally attached to the base member.

12. The electrical connector as claimed in claim 11, wherein the stiffener is configured with a hook and a latch, respectively at two opposite ends thereof, both of the hook and the latch engaging with the socket body to lock the cover to tightly cover upon the socket body.

13. The electrical connector as claimed in claim 8, wherein each fastener is configured with a spring member disposed thereon for elastically abutting against the heat sink.

14. An electrical connector assembly comprising:
   an insulative housing having a plurality of contacts therein;
   a cover defining opposite first and second ends, the first end pivotally mounted at one end of the housing and having the second end being equipped with a latch located on the other end of the housing;
   a heat sink mounted upon an upper face of the cover; and
   a plurality of fasteners fixed to an undersurface of the heat sink; wherein
   each of said fastener is equipped with a spring to urge the heat sink downwardly so as to have said heat sink be in a floating manner.

15. The electrical connector assembly as claimed in claim 14, wherein said fasteners cooperate with the heat sink to sandwich the cover therebetween.

16. The electrical connector assembly as claimed in claim 15, wherein a lower end of the spring abuts against the fastener and an upper end of the spring abuts against an undersurface of the cover.

* * * * *